(12) United States Patent
Tsao et al.

(10) Patent No.: US 9,006,072 B2
(45) Date of Patent: Apr. 14, 2015

(54) METHOD OF FORMING METAL SILICIDE LAYER

(71) Applicant: United Microelectronics Corp., Hsin-Chu (TW)

(72) Inventors: Po-Chao Tsao, New Taipei City (TW); Chien-Ting Lin, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/802,812

(22) Filed: Mar. 14, 2013

(65) Prior Publication Data
US 2014/0273386 A1 Sep. 18, 2014

(51) Int. Cl.
| | |
|---|---|
| *H01L 21/336* | (2006.01) |
| *H01L 29/66* | (2006.01) |
| *H01L 21/8234* | (2006.01) |
| *H01L 21/768* | (2006.01) |

(52) U.S. Cl.
CPC ...... *H01L 29/665* (2013.01); *H01L 21/823418* (2013.01); *H01L 21/76843* (2013.01); *H01L 21/76897* (2013.01); *H01L 21/76814* (2013.01)

(58) Field of Classification Search
CPC ............ H01L 21/768; H01L 23/53238; H01L 23/481; H01L 23/53295; H01L 21/76877; H01L 23/5226; H01L 27/092; H01L 29/785; H01L 29/78; H01L 21/76843; H01L 27/1211; H01L 29/66795; H01L 21/823418; H01L 21/76814; H01L 21/76897
USPC ......... 438/571, 586, 597, 154, 197, 199, 231, 438/275, 301, 625–627, 629, 637, 682, 683, 438/643, 644, 649, 651, 655, 303, 299; 257/347, 369, 371, 382, 384, 750, 751, 257/753, 754, 757, 766, 775, 915, E21.593, 257/E27.062
See application file for complete search history.

(56) References Cited

U.S. PATENT DOCUMENTS

| | | | |
|---|---|---|---|
| 5,998,873 A | 12/1999 | Blair | |
| 6,383,878 B1 * | 5/2002 | Huang | ........................... 438/299 |
| 6,482,699 B1 * | 11/2002 | Hu et al. | ........................ 438/258 |
| 6,815,298 B2 * | 11/2004 | Tsuchiaki | ..................... 438/299 |
| 7,214,620 B2 | 5/2007 | Kim | |
| 7,768,074 B2 | 8/2010 | Golonzka | |
| 8,835,209 B2 * | 9/2014 | Kronholz et al. | ............... 438/69 |
| 2008/0173947 A1 | 7/2008 | Hou | |
| 2010/0040768 A1 | 2/2010 | Dhindsa | |
| 2011/0156107 A1 * | 6/2011 | Bohr et al. | ..................... 257/288 |
| 2012/0261770 A1 * | 10/2012 | Lin et al. | ........................ 257/410 |
| 2013/0029464 A1 * | 1/2013 | Flachowsky et al. | ......... 438/199 |
| 2014/0264480 A1 * | 9/2014 | Tsao et al. | ..................... 257/288 |

* cited by examiner

*Primary Examiner* — Victor A Mandala
(74) *Attorney, Agent, or Firm* — Winston Hsu; Scott Margo

(57) ABSTRACT

A method of forming a metal silicide layer includes the following steps. At first, at least a gate structure, at least a source/drain region and a first dielectric layer are formed on a substrate, and the gate structure is aligned with the first dielectric layer. Subsequently, a cap layer covering the gate structure is formed, and the cap layer does not overlap the first dielectric layer and the source/drain region. Afterwards, the first dielectric layer is removed to expose the source/drain region, and a metal silicide layer totally covering the source/drain region is formed.

20 Claims, 5 Drawing Sheets

METHOD OF FORMING METAL SILICIDE LAYER

BACKGROUND OF THE INVENTION

1. Field of the Invention

The present invention relates to a method of forming a metal silicide layer, and more particularly, to a method of forming a metal silicide layer totally covering the source/drain region.

2. Description of the Prior Art

Poly-silicon is conventionally used as a gate electrode in semiconductor devices, such as the metal-oxide-semiconductor (MOS). However, with a trend toward scaling down the size of semiconductor devices, the conventional poly-silicon gate has faced problems such as inferior performances due to boron penetration and unavoidable depletion effect, which increases the equivalent thickness of the gate dielectric layer, reduces the gate capacitance, and lowers a driving force of the devices. Therefore, work function metals are used to replace the conventional poly-silicon gate to be the metal gate that is suitable for the high-k gate dielectric layer.

In conventional arts, after forming the transistor with a metal gate, a wiring system is formed thereon to electrically connect the metal gate and the source/drain regions, thereby providing signal input/output pathways for the transistor. The wiring system includes a plurality of contact plugs. The conventional method of forming contact plugs includes the following steps. An inter-layer dielectric (ILD) layer is formed to cover the transistor and the source/drain region at two sides of the transistor, then, the ILD layer is patterned to form a plurality of contact holes that expose the source/drain region. Subsequently, a metal layer such as a tungsten (W) layer is deposited into the contact holes to form the contact plugs connected to the source/drain region.

When the critical dimension (CD) of the transistor decreases, the space between the transistors decreases as well, and a location shift of the formed contact holes during the contact plug process may occur more easily, therefore, the later formed contact plugs may simultaneously contact the metal gate and the source/drain regions thereby causing short circuits more frequently, which may induce unexpected electrical performances of the transistor. Additionally, as the contact hole shift from its predetermined location or the size of the contact hole decreases with the decreasing critical dimension (CD) of the transistor, the area of the metal salicide layer formed on the source/drain region exposed by the contact hole may decrease as well, therefore, the ohmic contact between the metal salicide layer and the later formed contact plug or the ohmic contact between the metal salicide layer and the source/drain region may not be formed properly, which lowers the performances of the transistor. Consequently, how to improve the manufacturing process of the metal salicide layer between the contact plug and the source/drain region is still an important issue in the field.

SUMMARY OF THE INVENTION

It is therefore one of the objectives of the present invention to provide a method of forming a metal silicide layer, in order to improve the performances of the transistor.

According to one exemplary embodiment of the present invention, a method of forming a metal silicide layer includes the following steps. At first, at least a gate structure, at least a source/drain region and a first dielectric layer are formed on a substrate, and the gate structure is aligned with the first dielectric layer. Subsequently, a cap layer covering the gate structure is formed, and the cap layer do not overlap the first dielectric layer and the source/drain region. Afterwards, the first dielectric layer is removed to expose the source/drain region, and a metal silicide layer totally covering the source/drain region is formed.

The gate structure can be covered by the cap layer during the process of removing the first dielectric layer and forming the metal silicide layer, in order to avoid the effects caused by the illustrated processes. For example, the gate structure may not contact the cleaning solution, the etchant or the chemical solvent used during the process of removing the first dielectric layer or removing the non-reacted metal material layer during the self-aligned metal silicide (salicide) process, in order to maintain the material properties of the gate structure. Furthermore, the metal silicide layer formed before the formation of the contact holes can cover the overall source/drain region, and the area of the metal silicide layer covering the source/drain region would not be limited to the size or the location of the contact hole, therefore, the resistance of the source/drain region can be effectively reduced, and the performances of the transistor can be improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
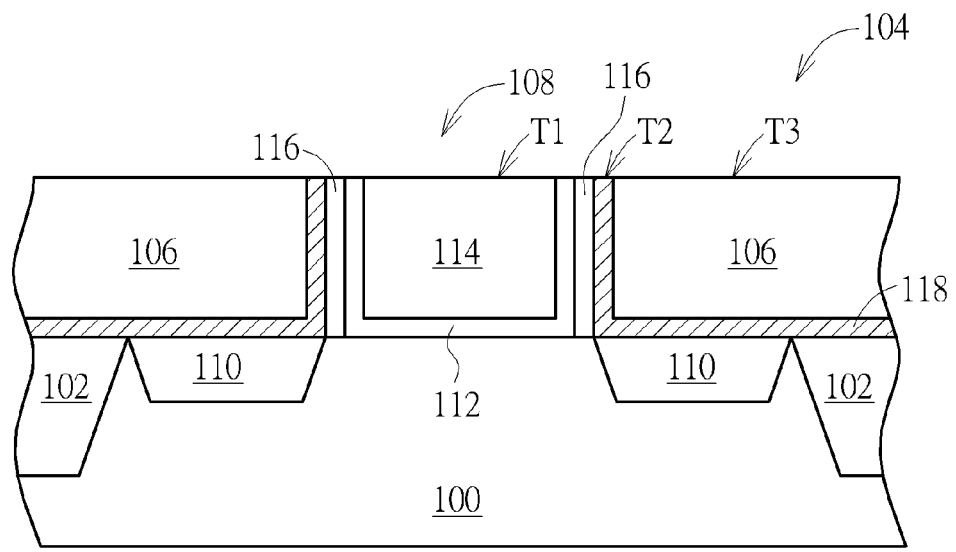
FIG. 1 through FIG. 10 illustrate a method of forming a metal silicide layer according to a preferred exemplary embodiment of the present invention.

Please refer to FIG. 1 through FIG. 10, which illustrate a method of forming a metal silicide layer according to a preferred exemplary embodiment of the present invention. As shown in FIG. 1, a semiconductor substrate 100 is provided, and a plurality of shallow trench isolations (STI) 102 are formed in the semiconductor substrate 100. The semiconductor substrate 100 can be a silicon substrate, an epitaxial silicon substrate, a silicon germanium substrate, a silicon carbide substrate, a silicon-on-insulator (SOI) substrate, or a substrate made of semiconductor material, but is not limited thereto. The STI 102 may include dielectric materials such as silicon oxide, or the STI 102 can be replaced by a dielectric structure such as field oxide (FOX). As the STI processes are known to those skilled in the art, the details are omitted herein for brevity.

At least a transistor 104 and a first dielectric layer 106 are disposed on the semiconductor substrate 100. The transistor 104 includes at least a gate structure 108 and at least source/drain regions 110, and the gate structure 108 includes a gate dielectric layer 112 and a metal gate 114 and at least a spacer 116. The gate dielectric layer 112 and the metal gate 114 are sequentially disposed on the semiconductor substrate 100 between the spacers 116, and the spacers 116 surround the gate dielectric layer 112 and the metal gate 114. The source/drain regions 110 are respectively disposed in the semiconductor substrate 100 at two sides of the gate structure 108. Various metal gate processes may be used in the present invention, including a gate-first process, a high-k first process integrated into the gate-last process, and a high-k last process integrated into the gate-last process. In this exemplary embodiment, the transistor 104 formed through the high-k last process integrated into the gate-last process is taken for example. The gate dielectric layer 112 including a high-k dielectric layer has a "U-shaped" cross section, and the gate dielectric layer 112 could be made of dielectric materials having a dielectric constant (k value) larger than 4. The material of the gate dielectric layer 112 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof. The gate dielectric layer 112 can be formed through an atomic layer deposition (ALD) process or a metal-organic chemical vapor deposition (MOCVD) process, but is not limited thereto. Furthermore, a dielectric layer (not shown) such as a silicon oxide layer can be selectively formed between the substrate 100 and the gate dielectric layer 112. The metal gate 114 contains one or a plurality of metal layer such as a work function metal layer, a barrier layer and a low-resistance metal layer. A work function metal layer is formed for tuning the work function of the later formed gate structure 108 to be appropriate in an NMOS or a PMOS. For an NMOS transistor, the work function metal layer having a work function ranging between 3.9 eV and 4.3 eV may include titanium aluminide (TiAl), zirconium aluminide (ZrAl), tungsten aluminide (WAl), tantalum aluminide (TaAl), or hafnium aluminide (HfAl), but it is not limited thereto. For a PMOS transistor, the work function metal layer having a work function ranging between 4.8 eV and 5.2 eV may include titanium nitride (TiN), tantalum nitride (TaN), tantalum carbide (TaC), but it is not limited thereto. The material of the barrier layer may include titanium (Ti), titanium nitride (TiN), tantalum (Ta) or tantalum nitride (TaN). Furthermore, the material of the low-resistance metal layer may include copper (Cu), aluminum (Al), titanium aluminum (TiAl), cobalt tungsten phosphide (CoWP) or any combination thereof.

The method of forming the gate structure 108 and the source/drain regions 110 may include the following steps. At first, at least a dummy gate structure (not shown) is formed on the semiconductor substrate 100, and then the spacers 116, the source/drain regions 110, a contact etch stop layer (CESL) 118 and the first dielectric layer 106 are sequentially formed on the substrate 100. The CESL 118 can be selectively disposed between the gate structure 108 and the first dielectric layer 106, and the material of the CESL 118 may include dielectric materials such as silicon nitride (SiN), nitrogen doped silicon carbide (NDC). The first dielectric layer 106 can be made of dielectric materials and be formed through a spin-on-coating (SOC) process, a chemical vapor deposition (CVD) process or other suitable process, and the dielectric materials include low dielectric constant (low-k) material (k value smaller than 3.9), ultra low-k (ULK) material (k value smaller than 2.6), or porous ULK material, but is not limited thereto. Then, a planarization process such as a chemical mechanical polish (CMP) process or an etching back process is performed to remove a part of the first dielectric layer 106, a part of the CESL 118 and a part of the spacers 116 until exposing the dummy gate structure, and then the dummy gate structure is partially removed to form a trench (not shown). Moreover, at least a dielectric material layer (not shown) and at least a metal material layer (not shown) are sequentially filled in the trench, and another chemical mechanical polishing (CMP) process is further performed to remove the dielectric material layer and the metal material layer outside the trench. Accordingly, the gate structure 108 including the gate dielectric layer 112 and the gate conductive layer 114 can be formed. The gate structure 108 is aligned with the first dielectric layer 106, and the CESL 118 is further aligned with the gate structure 108 and the first dielectric layer 106. In other words, a top surface T1 of the gate structure 108, a top surface T2 of the CESL 118 and a top surface T3 of the first dielectric layer 106 are coplanar.

Figure 2:
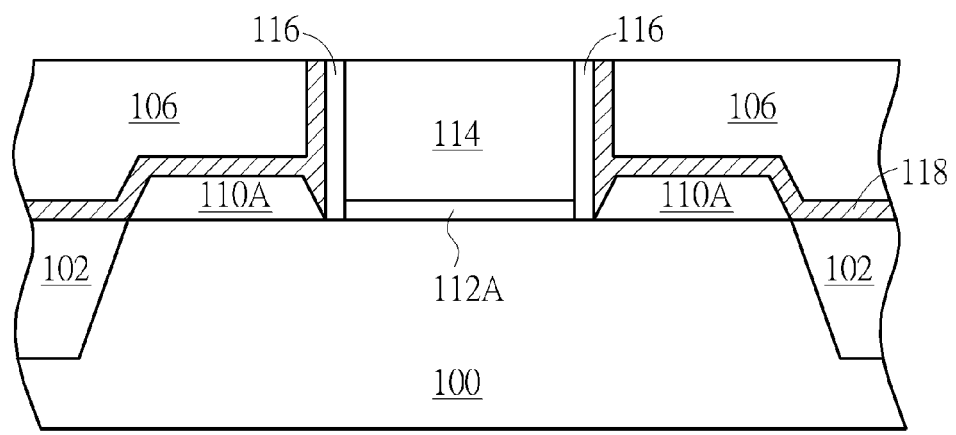

In another exemplary embodiment, as shown in FIG. 2, the gate dielectric layer 112A is formed by a "high-k first" process (that is, the gate dielectric layer is formed before the dummy gate) and its cross section therefore has a "-" shape, which is different from the "U" shaped gate dielectric layer 112 of the embodiment as shown in FIG. 1, which was formed by a "high-k last" process (that is, the gate dielectric layer is formed after removing the dummy gate). Moreover, the CESL 118 can also include a stress.

In other aspects, the source/drain regions 110 may include doped source/drain regions formed through ion implantation processes, and the shapes of the source/drain regions 110 can be modified according to the stress which is predetermined to be induced to the channel region. In addition, each component of the transistor can have different embodiments according to different designs of the devices. For example, the source/drain regions can include an epitaxial layer formed by a selective epitaxial growth (SEG) process, wherein the epitaxial layer can be directly formed on the semiconductor substrate 100 such as the source/drain regions 110A shown in FIG. 2, or recesses are previously formed at two sides of the gate structure 108 and an epitaxial layer is further formed to fill the recesses such as the source/drain regions 110 shown in FIG. 1, in order to induce stress to the channel region underneath the gate structure 108. In this exemplary embodiment, when the transistor 104 serves as an NMOS, the epitaxial layer in the source/drain regions 110 can be made of SiP or SiC to provide tensile stress to the channel region. Furthermore, when the transistor 104 serves as a PMOS, the epitaxial layer in the source/drain regions 110 can be made of SiGe to provide compressive stress to the channel region, but is not limited thereto. Additionally, a dry etching process, a wet etching process or a combination thereof can be performed to form the recesses with various types of shapes, such as a barrel shaped recess, a hexagonal recess or an octagonal recess. Therefore, the epitaxial layer later formed in such recesses may have a hexagonal (also called "sigma Σ") or an octagonal cross section, in which a flat bottom surface of the epitaxial layer is disposed in the substrate 100 to further enhance the stress effect on the channel region. The embodiments illustrated above are only shown for example. The transistor in the present invention can have a variety of embodiments, which are not described for the sake of simplicity. The following description is based on the transistor 104 of the embodiment shown in FIG. 1.

Subsequently, a cap layer covering the gate structure 108 is formed, and the cap layer does not overlap the CESL 118, the first dielectric layer 106 and the source/drain region 110. The cap layer may include a single-layer structure or multi-layer structure made of dielectric materials such as silicon oxide (SiO), silicon nitride (SiN), silicon carbide (SiC), silicon carbonitride (SiCN), silicon oxynitride (SiON) or a combination thereof.

Figure 3:
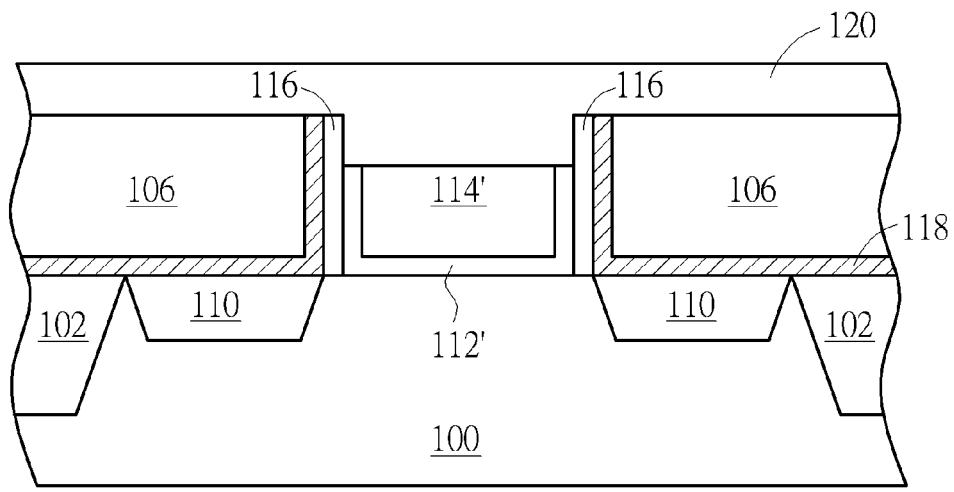
Figure 4:
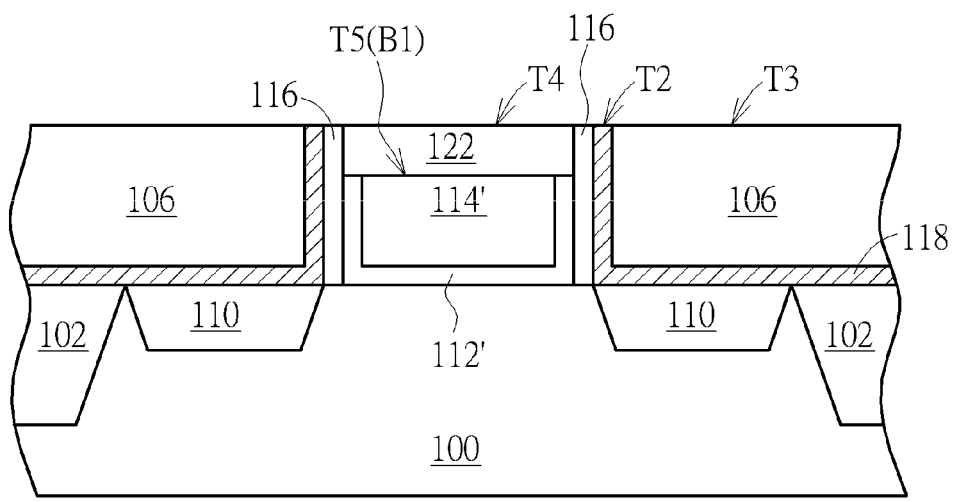

In one exemplary embodiment, the method of forming the cap layer may include the following steps. As shown in FIG. 3, at first, a part of the gate structure 108 consisting of a part of the metal gate 114 and a part of the gate dielectric layer 112 is removed to form a recess R between the two spacers 116. Subsequently, a deposition process is performed to fill a cap material layer 120 in the recess R. Furthermore, as shown in FIG. 4, a planarization process is performed to remove the excessive cap material layer 120 outside the recess R, and the remaining cap material layer 120 in the recess R may serve as a cap layer 122. The cap layer 122 is aligned with the spacer 116, the CESL 118 and the first dielectric layer 106, and the cap layer 122 can conformally cover the remaining metal gate 114' and the remaining gate dielectric layer 112'. More specifically, a top surface T4 of the cap layer 122, the top surface T2 of the CESL 118 and the top surface T3 of the first dielectric layer 106 are coplanar, and a bottom surface B1 of the cap layer 122 may contact a top surface T5 of the remaining metal gate 114'. Moreover, the spacers 116 surround the remaining gate dielectric layer 112' and the remaining metal gate 114', and further surround the cap layer 122.

Figure 5:
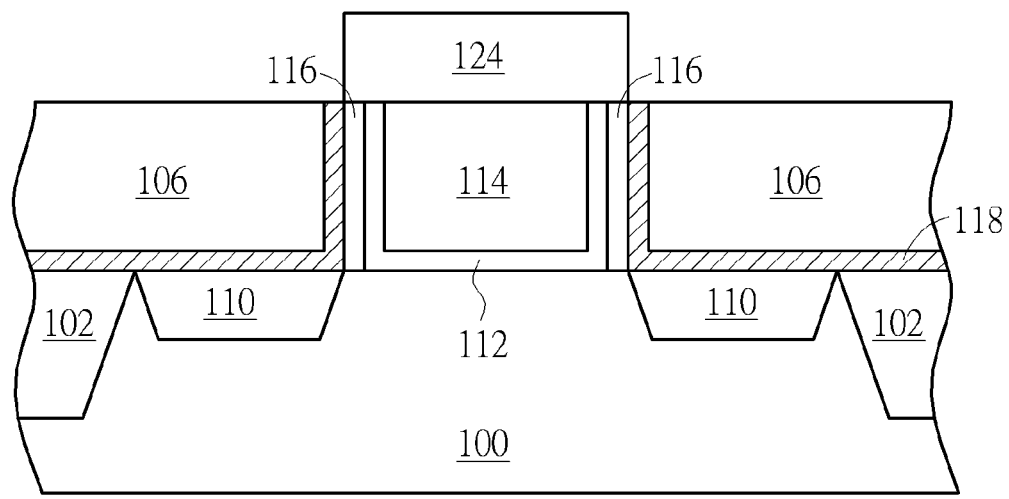

Removing a part of the metal gate 114 may affect the performance of the transistor 104, therefore, in another exemplary embodiment, the cap layer is formed through a patterning process, and the metal gate 114 keeps its original structure. The method of forming the cap layer may include the following steps. At first, as shown in FIG. 5, a deposition process is performed to form a cap material layer simultaneously covering the gate structure 108, the CESL 118 and the first dielectric layer 106. Then, a patterned mask layer (not shown) such as a patterned photoresist layer is formed on the cap material layer, and one or more etching processes are performed to remove a part of the cap material layer. Finally, the patterned mask layer is removed and the remaining cap material layer may serve as a cap layer 124. The cap layer 124 preferably conformally covers the metal gate 114 and the boundary between the metal gate 114 and each of the spacers 116. Moreover, the size, the shape or the location of the cap layer 124 can be modified, therefore, the cap layer 124 may totally cover or partially cover the spacer 116, and the cap layer 124 still does not directly contact the CESL 118 and the first dielectric layer 106.

Figure 6:
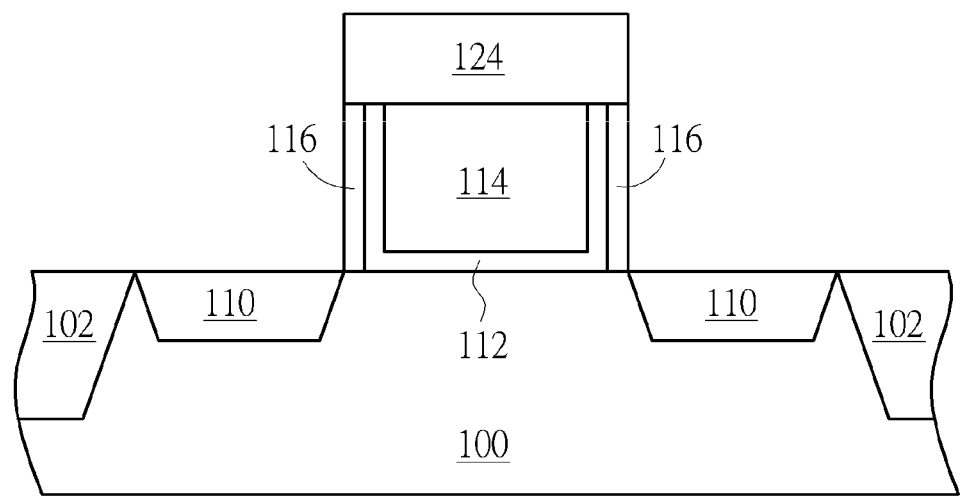

As shown in FIG. 6, the first dielectric layer 106 is removed to expose the source/drain region. The method of removing the first dielectric layer 106 includes performing an etching process with an etchant have etching selectivity to the first dielectric layer 106. In other words, when an etchant is used to remove the first dielectric layer 106, a removing rate of the first dielectric layer 106 is substantially higher than a removing rate of the CESL 118 and a removing rate of the cap layer 124, so as to only remove the overall first dielectric layer 106. In other exemplary embodiments, the first dielectric layer could be partially removed, i.e. the first dielectric layer overlapping the source/drain regions is removed and the first dielectric layer outside the active area such as the first dielectric layer overlapping the STI. Meanwhile, the CESL 118 and the cap layer 124 still keep the original structure. Afterwards, the CESL 118 could be totally removed or partially removed; for example, the CESL 118 overlapping the source/drain regions 110 could be removed until exposing the source/drain regions 110. Due to the disposition of the cap layer 124 on the gate structure 108, the metal gate 114 will not contact the cleaning solution, the etchant or the chemical solvent used in the processes of removing the first dielectric layer 106 and removing the CESL 118, in order to maintain the material properties of the metal gate 114.

Figure 7:
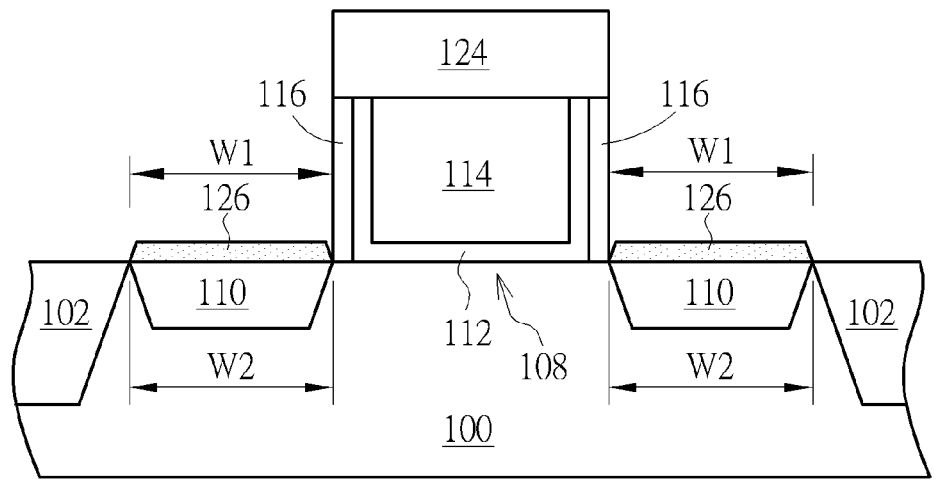

As shown in FIG. 7, a self-aligned metal silicide (salicide) process can be performed. A metal layer made of materials such as cobalt (Co), titanium (Ti), tantalum (Ta), platinum (Pt), palladium (Pd), molybdenum (Mo), etc. is first formed on the source/drain regions 110 and the cap layer 124, then, at least one rapid thermal anneal (RTP) process is performed to have the metal layer react with the silicon epitaxial layer of the source/drain regions 110, and a metal silicide layer 126 can be formed on the overall surface of the source/drain regions 110. Finally, the non-reacted metal layer is removed, and the formed metal silicide layer 126 totally covers the source/drain regions 110. Similarly, the cap layer 124 disposed on the gate structure 108 may prevent the metal gate 114 from contacting the metal layer or the cleaning solution, the etchant or the chemical solvent used for removing the non-reacted metal layer in the self-aligned metal silicide process, in order to keep the material properties of the metal gate 114. Additionally, it is appreciated that, the first dielectric layer 106 previously covering the source/drain regions 110 has been totally removed, so that the source/drain regions 110 can be totally exposed. Accordingly, the layout of the formed metal silicide layer 126 could be similar to the layout of the source/drain regions 110 i.e. the area of the metal silicide layer 126 could be close to the area of the source/drain regions 110. Furthermore, a width of the metal silicide layer 126 is substantially the same as a width of the source/drain region 110; in other words, a width W1 of the metal silicide layer 126 along a direction such as a horizontal direction X is substantially the same as a width W2 of the source/drain region 110 along the same direction.

Figure 8:
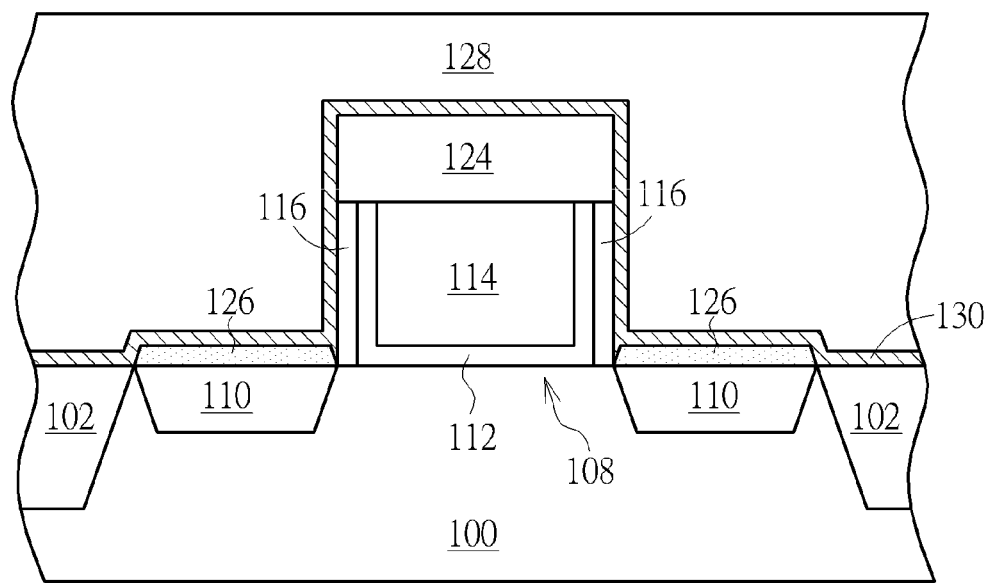

As shown in FIG. 8, in order to later form the contact plug connected to the source/drain region 110, a dielectric layer i.e. a second dielectric layer 128 is conformally formed again on the substrate 100 to substitute for the removed first dielectric layer 106 which was originally on the source/drain region 110, and a planarization process is further performed on the second dielectric layer 128, therefore, the second dielectric layer 128 could have a substantially planar top surface. The second dielectric layer 128 can be made of dielectric materials and formed through a spin-on-coating (SOC) process, a chemical vapor deposition (CVD) process or other suitable process. The material of the second dielectric layer 128 and the material of the first dielectric layer 106 can be the same or different. The second dielectric layer 128 may cover the cap layer 124 and the metal silicide layer 126. More specifically, the second dielectric layer 128 may directly contact the cap layer 124 and the metal silicide layer 126 without the first dielectric layer 106 disposed between the second dielectric layer 128 and the cap layer 124 and between the second dielectric layer 128 and the metal silicide layer 126. The second dielectric layer 128 may directly contact at least a side of the gate structure 108 such as a side of the spacer 116 of the gate structure 108. Furthermore, after forming the metal silicide layer 126 and before forming the second dielectric layer 128, a contact etch stop layer (CESL) 130 can be selectively formed on the substrate 100, and the CESL 130 may cover the cap layer 124 and the metal silicide layer 126. The disposition of the CESL 130 can help to maintain the completeness of the metal silicide layer 126 in the later contact hole process. The material of the CESL 130 may include dielectric materials such as silicon nitride (SiN), nitrogen doped silicon carbide (NDC).

Figure 9:
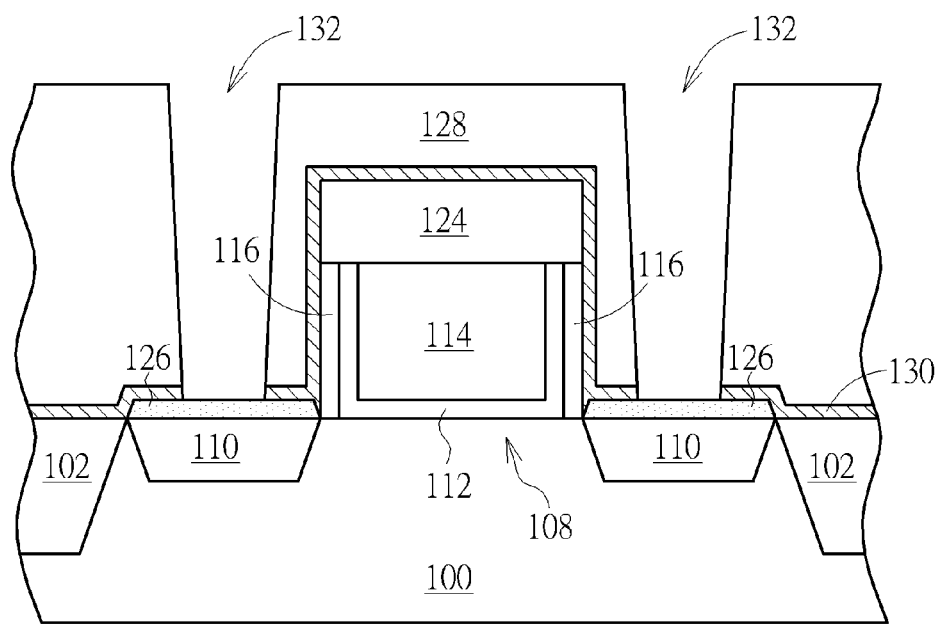

As shown in FIG. 9, a part of the second dielectric layer 128 and a part of the CESL 130 are removed until exposing the metal silicide layer 126 to form at least a contact hole 132 over the metal silicide layer 126 and in the second dielectric layer 128. The contact holes 132 respectively reach the metal silicide layer 126 on the source/drain region 110 at at least a side of the gate structure 108. In other words, the contact holes 132 may expose a part of the metal silicide layer 126. Each of the contact holes 132 is not limited to a single opening, i.e. the contact holes 132 may respectively include a plurality of individual openings or an elongated slot. The slot can extend along a direction parallel to a direction the gate structure 108 extends towards to, i.e. the direction perpendicular to the surface of the paper, on the source/drain region 110, in which the slot preferably extends on the overall source/drain region 110, in order to increase the contact surface between the later formed contact plug and the source/drain region 110 and thereby reducing the resistance. In other words, the size, the shape, the number, or the layout of the contact holes 132 can be modified according to process requirements. Additionally, the contact holes 132 overlapping two source/drain regions 110 can be formed in one patterning process with a single mask and a patterned photoresist layer or by the double patterning technique (DPT) process.

The method of forming the contact holes 132 may include the following steps, but not limited thereto. At first, a mask (not shown) is formed on the second dielectric layer 128, and the mask preferably is a multi-layered mask that may include an advanced patterning film (APF) such as amorphous carbon layer, a dielectric anti-reflective coating (DARC) layer, a bottom anti-reflective coating (BARC) and a patterned photoresist layer sequentially disposed on the second dielectric layer 126. The APF has a high aspect ratio (HAR), a low line edge roughness (LER) and PR-like ashability, so that it is widely used in semiconductor processes with line widths smaller than 60 nm. Then, the patterned photoresist layer is used as a mask and one or more etching processes, such as an anisotropic dry etching process, are performed to remove the second dielectric layer 128 not covered by the patterned photoresist layer until the CESL 130 is exposed on the source/drain regions 110, and the exposed CESL 130 is further removed to complete the formation of the contact holes 132.

It is appreciated that, in this exemplary embodiment, a material of the cap layer 124 is such as silicon nitride (SiN) and a material of the CESL 130 such as nitrogen doped silicon carbide (NDC) are different from a material of the second dielectric layer 128 such as silicon oxide (SiO). Accordingly, with the etchant used during the formation of the contact holes 132, a removing rate of the second dielectric layer 128 is preferably substantially larger than a removing rate of the cap layer 124 and a removing rate of the CESL 130. Moreover, when the sizes of the contact holes at two sides of the gate structure are different, or when the formed contact hole shift from the predetermined location, the formed contact hole may partially overlap the gate structure. Meanwhile, the cap layer 124 can still conformally cover the gate structure 108; in other words, the material properties and the thickness of the cap layer 124 are required to be able to sufficiently maintain the completeness of the gate structure 108 during the manufacturing process of the contact holes 132. The disposition of the cap layer 124 is beneficial for increasing the process window of the contact hole process.

Figure 10:
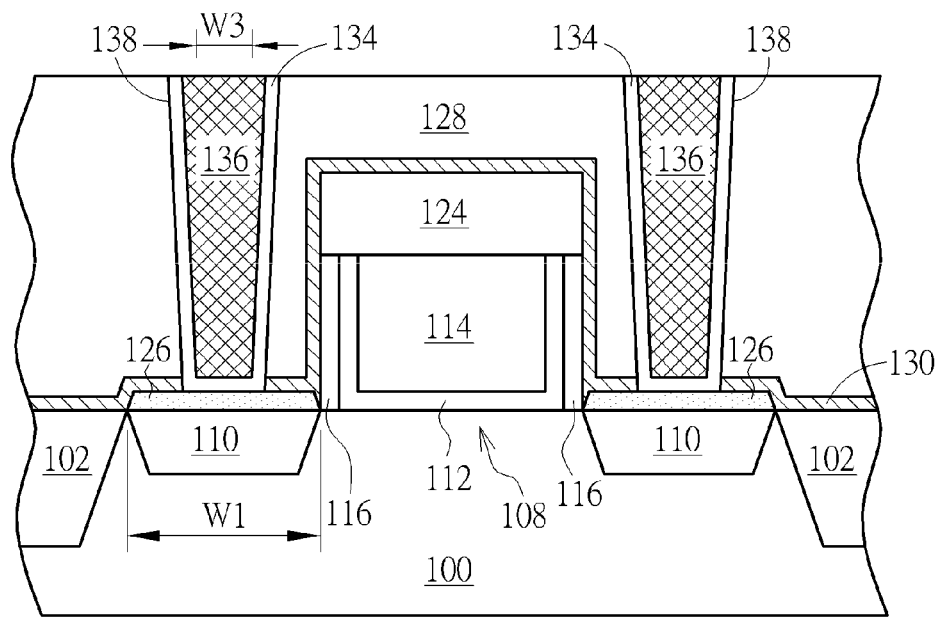

As shown in FIG. 10, contact plugs 138 are further formed in the contact holes 132. The steps of forming the contact plugs are illustrated below. At first, a barrier/adhesive layer 134, a seed layer (not shown) and a conductive layer 136 are sequentially formed on the substrate 100 to cover the second dielectric layer 128 and fill the contact holes 132. The barrier/adhesive layer 134 is formed conformally along the surfaces of the contact holes 132, and the conductive layer 136 completely fills the contact holes 132. The barrier/adhesive layer 134 could be used for preventing metal elements of the conductive layer 136 from diffusing into the neighboring second dielectric layer 128, and the barrier/adhesive layer 134 can also increase the adhesivity between the conductive layer 136 and the second dielectric layer 128. A material of the barrier/adhesive layer 134 may include tantalum (Ta), titanium (Ti), titanium nitride (TiN) or tantalum nitride (TaN) or a suitable combination of metal layers such as Ti/TiO, but is not limited thereto. A material of the seed layer is preferably the same as a material of the conductive layer 136, and a material of the conductive layer 136 may include a variety of low-resistance metal materials, such as aluminum (Al), titanium (Ti), tantalum (Ta), tungsten (W), niobium (Nb), molybdenum (Mo), copper (Cu) or the likes, preferably tungsten or copper, and more preferably tungsten, which can form suitable Ohmic contact between the conductive layer 136 and the metal silicide layer 126 or between the conductive layer 136 and the below source/drain regions 110. Then, a planarization step, such as a chemical mechanical polish (CMP) process or an etching back process or their combination, can be performed to remove the barrier/adhesive layer 134, the seed layer and the conductive layer 136 outside contact holes 132, therefore, a top surface of a remaining conductive layer 136 and the top surface of the second dielectric layer 128 are coplanar, and a plurality of contact plugs 138 i.e. the source/drain region contact plugs is completed. In this exemplary embodiment, the formed metal silicide layer 126 can totally cover the overall source/drain regions 110, and the contact holes 132 only overlap a part of the source/drain regions 110 i.e. expose a part of the metal silicide layer 126, therefore, a bottom width W3 of the contact plugs 138 along a direction such as a horizontal direction X is substantially smaller than the width W1 of the metal silicide layer 126 along the same direction.

In conclusion, the gate structure can be covered by the cap layer during the process of removing the first dielectric layer and forming the metal silicide layer, in order to avoid the effects caused by the illustrated processes. For example, the gate structure may not contact the cleaning solution, the etchant or the chemical solvent used in the process of removing the first dielectric layer or removing the non-reacted metal material layer during the self-aligned metal silicide (salicide) process, in order to maintain the material properties of the gate structure. Furthermore, the metal silicide layer formed before the formation of the contact holes can cover the overall source/drain region, and the area of the metal silicide layer covering the source/drain region would not be limited to the size or the location of the contact hole, therefore, the resistance of the source/drain region can be effectively reduced, and the performances of the transistor can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method of forming a metal silicide layer, comprising:
   forming at least a gate structure, at least a source/drain region and a first dielectric layer on a substrate, wherein the gate structure is aligned with the first dielectric layer;
   forming a cap layer covering the gate structure, wherein the cap layer does not overlap the first dielectric layer and the source/drain region;
   completely removing the first dielectric layer to expose the source/drain region so that none of the first dielectric layer remains on the substrate; and
   forming a metal silicide layer covering the source/drain region.

2. The method of forming a metal silicide layer according to claim 1, wherein a width of the metal silicide layer is the same as a width of the source/drain region.

3. The method of forming a metal silicide layer according to claim 1, further comprising:
  forming a second dielectric layer covering the cap layer and the metal silicide layer;
  removing a part of the second dielectric layer until exposing the metal silicide layer to form at least a contact hole over the metal silicide layer and in the second dielectric layer;
  forming a conductive layer covering the second dielectric layer and filling the contact hole; and
  removing a part of the conductive layer for forming at least a contact plug in the second dielectric layer.

4. The method of forming a metal silicide layer according to claim 3, wherein the second dielectric layer directly contacts at least a side of the gate structure.

5. The method of forming a metal silicide layer according to claim 3, wherein the second dielectric layer directly contacts the cap layer and the metal silicide layer.

6. The method of forming a metal silicide layer according to claim 3, wherein a bottom width of the contact plug is smaller than a width of the metal silicide layer.

7. The method of forming a metal silicide layer according to claim 1, further comprising forming a contact etch stop layer (CESL) on the substrate before forming the cap layer.

8. The method of forming a metal silicide layer according to claim 7, wherein the CESL is between the first dielectric layer and the gate structure.

9. The method of forming a metal silicide layer according to claim 7, wherein the CESL is further aligned with the gate structure and the first dielectric layer.

10. The method of forming a metal silicide layer according to claim 7, wherein the cap layer does not overlap the CESL.

11. The method of forming a metal silicide layer according to claim 7, further comprising removing the CESL until exposing the source/drain region after removing the first dielectric layer.

12. The method of forming a metal silicide layer according to claim 1, further comprising forming a contact etch stop layer (CESL) on the substrate after forming the metal silicide layer.

13. The method of forming a metal silicide layer according to claim 12, wherein the CESL covers the cap layer and the metal silicide layer.

14. The method of forming a metal silicide layer according to claim 13, further comprising:
  forming a second dielectric layer covering the CESL;
  removing a part of the second dielectric layer and a part of the CESL until exposing the metal silicide layer to form at least a contact hole over the metal silicide layer and in the second dielectric layer;
  forming a conductive layer covering the second dielectric layer and filling the contact hole; and
  removing a part of the conductive layer for forming at least a contact plug in the second dielectric layer.

15. The method of forming a metal silicide layer according to claim 1, wherein the method of forming the cap layer comprising:
  removing a part of the gate structure to form a recess;
  filling a cap material layer in the recess; and
  performing a planarization process to align the cap layer with the first dielectric layer.

16. The method of forming a metal silicide layer according to claim 1, wherein the gate structure comprises a gate dielectric layer and a metal gate.

17. The method of forming a metal silicide layer according to claim 16, wherein the metal gate comprises a work function metal layer, a barrier layer and a low-resistance metal layer.

18. The method of forming a metal silicide layer according to claim 16, wherein the gate structure further comprises at least a spacer surrounding the gate dielectric layer and the metal gate.

19. The method of forming a metal silicide layer according to claim 18, wherein the cap layer totally covers the metal gate, and totally covers or partially covers the spacer.

20. The method of forming a metal silicide layer according to claim 18, wherein the spacer further surrounds the cap layer.

* * * * *